United States Patent [19]

Pellegrino

[11] Patent Number: 4,631,100
[45] Date of Patent: Dec. 23, 1986

[54] METHOD AND APPARATUS FOR MASS PRODUCING PRINTED CIRCUIT BOARDS

[76] Inventor: Peter P. Pellegrino, 216 Edgewood La., Apple Valley, Minn. 55124

[21] Appl. No.: 671,672

[22] Filed: Nov. 15, 1984

Related U.S. Application Data

[63] Continuation-in-part of Ser. No. 439,333, Jan. 10, 1983, Pat. No. 4,521,262.

[51] Int. Cl.$^4$ .................. C25D 7/00; C23F 1/02; B05D 5/00; B44C 1/22
[52] U.S. Cl. .................. 156/150; 29/847; 29/848; 156/233; 156/235; 156/631; 156/902; 428/601; 428/901
[58] Field of Search .................. 156/629–634, 156/643, 645, 656, 659.1, 666, 901, 902, 150, 151, 233, 235, 247–249; 29/846, 847, 848, 852; 174/68.5; 430/313, 318; 427/97; 204/15, 24, 38 B; 428/601, 174, 901

[56] References Cited

U.S. PATENT DOCUMENTS

| | | | |
|---|---|---|---|
| 2,695,351 | 11/1954 | Beck | 29/846 X |
| 3,264,152 | 8/1966 | Haydon | 156/634 X |
| 3,962,002 | 6/1976 | Finkbeiner et al. | 156/645 |
| 4,181,563 | 1/1980 | Miyaka et al. | 156/643 |
| 4,372,804 | 2/1983 | Hanabusa et al. | 156/631 |

OTHER PUBLICATIONS

IBM Tech. Disc. Bulletin, vol. 21, No. 4, Sep. 1978, Multilayer Laminated Chip Carrier, pp. 1396–1397.

*Primary Examiner*—William A. Powell
*Attorney, Agent, or Firm*—Blakely, Sokoloff, Taylor & Zafman

[57] ABSTRACT

The present invention contemplates fabrication of a printed circuit board blank having a predetermined pattern of pads and interconnecting conductive pathways, preferably (but not necessarily) flush with the face of the insulating substrate. To fabricate a finished circuit board of any desired circuit configuration, the printed circuit board blank is coated with a photoresist and exposed so that upon development of the photoresist and etching in accordance with the developed pattern, the interconnecting conductive pathways between pads will be selectively etched away so that only those interconnects for the desired circuit pattern remain. While contact printing or image exposure systems may be used to expose the photoresist, computer controlled raster scan laser printers offer the combination of speed and versatility, as the predetermined starting matrix of the invention is highly conductive to computer aided design, and the percentage of circuit board area required for exposure is very small compared to normal copper-clad board fabrication techniques. For multilayer printed circuit boards, registration apertures are provided in each board layer for alignment purposes. Interconnects between boards are made by drilling through selective pads and plating the through holes to interconnect the various board layers. Isolation of any layer of any plated through hole may be obtained by either isolation of the pad (removal of all pad interconnects) at the through hole, or alternatively by etching a larger diameter in the pad which region will be filled with laminating adhesive during the lamination process to insulate the pad from the through hole copper plating.

33 Claims, 6 Drawing Figures

METHOD AND APPARATUS FOR MASS PRODUCING PRINTED CIRCUIT BOARDS

This is a continuation-in-part of application Ser. No. 439,333, filed Jan. 10, 1983, now U.S. Pat. No. 4,521,262, entitled Method for Mass Producing Printed Circuit Boards.

BACKGROUND OF THE INVENTION

1. Field of the Invention

This invention relates to the field of printed circuit board manufacture.

2. Prior Art

There are many methods of manufacturing printed circuit boards used extensively throughout the electronics industry. The advent of large scale integrated circuits ("LSI") and very large scale integrated circuits ("VLSI") has created an ever increasing demand for a fast, economical way of mass producing printed circuit boards which are ready for component connections.

One method of mass producing printed circuit boards entails forming preselected paths on prefabricated circuit boards with conductor pathways affixed thereon such as is disclosed in Chiaretta, U.S. Pat. No. 3,584,183. In Chiaretta, a first set of parallel conductors is disposed on a circuit board by standard fabrication techniques so that it is electrically connected to the diode elements fabricated within the board. A second set of parallel conductors is disposed so as to cross the first set of conductors. The connections between the conductors and the diodes are selectively removed to provide the desired circuit configuration. Such selected removal of connections is achieved by selectively bombarding these connections with a pulsed laser beam to burn them away. To accomplish the removal, the patent discloses an automatically controlled movable table with high precision indexing, a small fixed laser, and a transport logic circuit which receives input information from a standard input system (such as a tape transport, card reader, etc.)

Another method of mass producing printed circuit board is disclosed in Winter et al, U.S. Pat. No. 3,148,438. In Winter, a regular pattern of strips of electrically conductive material is bonded on one side of a insulative material board. The board is provided with a multiplicity of regularly distributed apertures which extend at spaced intervals in a grid pattern through the conducting strips. The circuit is constructed by inserting the terminals of circuit components through the appropriate apertures on the opposite side of the board and soldering the terminals to the conductor strips. The conducting strips are interrupted where necessary to establish the conductive pathways by utilizing a manual cutting tool such as a spotface cutter. As an alternative, the conductive strips may be interrupted prior to affixing the circuit components.

A further method of mass producing printed circuit boards is disclosed in Goodwin Jr. et al, U.S. Pat. No. 3,226,802. In Goodwin, premade copper conductor pathways are fabricated on both sides of a board, apertures are made in the board and are filled with conductive material to electrically interconnect the conductors on each side of the board. The apertures are selectively broken according to a preselected circuit pattern by a manually operated machine.

In all of the prior art patents, the connections between the conductors are selectively interrupted either by mechanically breaking a conductor path or by utilizing a laser to cut or burn the conductor connections away. Each interruption occurs one at a time. Thus, for applications where there may be over 24,000 interruptions on one board, removal of the conductor connections may take up to several months to complete. Further, in LSI and VLSI circuit applications, the conductor pathways are extremely thin and close together. Therefore, it would be quite difficult to burn interruptions in the conductors patterns and maintain a high degree of reliability even with the aid of a microscope and a very skilled technician. Again, this process would take extremely long periods of time to complete.

In applications where the printed circuit boards are attached to each other to form a multilayer printed circuit board, provisions must be made to connect the pathways of the various boards which are stacked together. In the prior art, apertures are formed in the printed circuit board which connect to each of the conductors. The apertures are plated through to connect conductors on one surface with conductors on the surface of an adjacent board. However, in some applications, it may be desirable to "jump around", i.e., connect alternative layers and/or alternative surfaces anywhere in the stack. In the prior art when the apertures in each board are plated through there will always be a connection with the conductors bordering the hole. Thus, it would be impossible to alternate the connections between different boards.

In the fabrication of multilayer circuit boards, the reliability of each layer is extremely crucial. Therefore, each layer must be inspected for accuracy. Typically, inspection in this field is rather slow and labor intensive since it is done visually by a skilled technician. It is quite common to spend up to four to eight hours inspecting one layer of 18 that are needed to make an LSI or VLSI multilayer circuit board.

SUMMARY OF THE INVENTION

The present invention contemplates fabrication of a printed circuit board blank having a predetermined pattern of pads and interconnecting conductive pathways, preferably (but not necessarily) flush with the face of the insulating substrate. To fabricate a finished circuit board of any desired circuit configuration, the printed circuit board blank is coated with a photoresist and exposed so that upon development of the photoresist and etching in accordance with the developed pattern, the interconnecting conductive pathways between pads will be selectively etched away so that only those interconnects for the desired circuit pattern remain. While contact printing or image exposure systems may be used to expose the photoresist, computer controlled raster scan laser printers offer the combination of speed and versatility, as the predetermined starting matrix of the invention is highly conducive to computer aided design, and the percentage of circuit board area required for exposure is very small compared to normal copper-clad board fabrication techniques. For multilayer printed circuit boards, registration apertures are provided in each board layer for alignment purposes. Interconnects between boards are made by drilling through selective pads and plating the through holes to interconnect the various board layers. Isolation of any layer of any plated through hole may be obtained by either isolation of the pad (removal of all pad interconnects) at the through hole, or alternatively by etching a larger diameter in the pad which region will be filled with laminating adhesive during the lamination process to insulate the pad from the through hole copper plating.

DETAILED DESCRIPTION OF THE INVENTION

Figure 1:
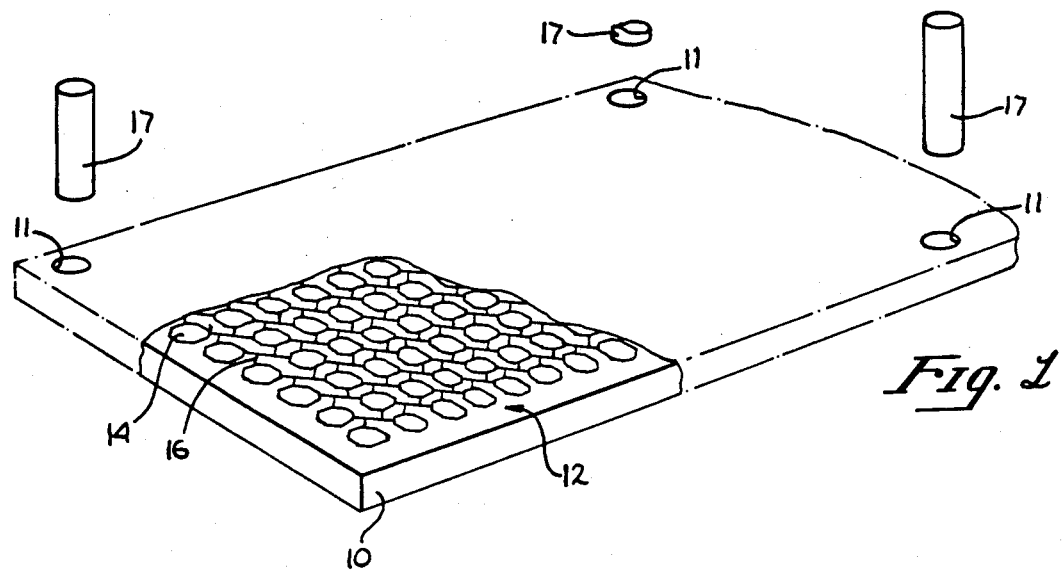
FIG. 1 is a perspective view, in schematic form, of a printed circuit board blank in accordance with the present invention.

First referring to FIG. 1, a printed circuit board blank in accordance with one embodiment of the present invention may be seen. The circuit board blank is generally comprised of a nonconductive substrate such as an epoxy glass substrate containing a pattern of conductors 12 characterized by a matrix of conductive pads 14 and conductive interconnects 16. In the preferred embodiment the pads 14 and interconnects 16 comprise a copper layer such as is generally found on a printed circuit board, though of course patterned as described. Unlike common printed circuit board copper layers however, the copper layer comprising the pattern of conductors 12 in the preferred embodiment is flush with the surface of the substrate 10, the copper projecting into the substrate rather than being raised as in the prior art. Typically, the printed circuit board blank of FIG. 1 would be sold with a layer of photoresist over the top surface thereof, with the printed circuit board blank sealed in an appropriate ultraviolet light resistant package, ready for opening and appropriate exposure by the printed circuit board maker.

The thickness of the printed circuit board substrate 10 generally will vary depending upon the specific intended purpose for the printed circuit board blank. In particular, for single layer boards a substrate of substantial thickness would be provided so as to provide the required structural integrity and stiffness in the finished board. Similar printed circuit board blanks would also be provided however, of substantially lesser thickness for use in the fabrication of multilayer printed circuit boards as hereinafter described, the finished multilayer board obtaining its strength and rigidity as a result of the laminating of a plurality of printed circuit boards manufactured from the printed circuit board blanks of the present invention. Finally, the printed circuit board blanks of the present invention would normally be provided with alignment holes 11 for alignment pins 17 accurately positioned with respect to the pattern of conductors 12 on the board, or both alignment marks and reference holes, to provide a convenient means of optically or mechanically aligning the pattern of conductors in exposure systems and during stacking of a multilayer board.

The printed circuit board blanks of the present invention can readily be manufactured in accordance with the method disclosed in my copending application entitled METHOD AND APPARATUS FOR MANUFACTURING MULTI LAYER PRINTED CIRCUIT BOARDS filed on Mar. 4, 1982 as Ser. No. 354,736, abandoned. In accordance with that method, a flash layer of conductive material, preferably copper, is electrodeposited onto the face of a rigid metal plate or metalized substrate preferably having a low coefficient of thermal expansion, such as a stainless steel plate. Thereafter, the face of the plate is covered with a photoresist which is exposed through a appropriate mask to define the desired conductive circuit pattern matrix in the resist. Preferably the exposure is by way of relatively well collimated light so that after the resist is developed the circuit pattern is defined by way of channels in the resist having straight and parallel walls as opposed to poorly defined or tapered walls. Obviously, either a negative or positive resist may be used though the desired result is to define channels exposing the flash layer of copper in the desired circuit pattern. However, it is preferred to use a resist wherein the exposed resist will be removed on development, as this minimizes the required total exposure area which, as shall subsequently be seen, is perhaps more conducive to the use of raster scan laser exposure systems.

Thereafter a second layer of electrodeposited copper of substantial thickness is built up on the physically exposed portions of the flash layer of copper at the bottom of the channels, which in effect forms a raised conductive circuit pattern in the desired pattern for the printed circuit board blank yet to be formed. The raised conductive circuit pattern should have a thickness coinciding with the desired thickness of the pattern in the finished circuit board and blank, though care should be taken to be assured that the resist is sufficiently thick so that the raised conductive circuit pattern does not have a thickness exceeding the depth of the channels, i.e., does not extend outward to form a mushroom-like pattern extending out of the channels. Obviously the electroplating of a conductive surface at the bottom of a very small channel having nonconductive walls may tend to invite air bubbles and other voids or otherwise poor plating in the corners of the channel. This may be avoided however, and very high quality plating achieved by using electroplating apparatus, commonly known as a high impingement speed plating apparatus, such as is taught in U.S. Pat. No. 4,174,261. In that regard, such plating apparatus is also ideal for putting down the initial flash layer of copper, as it will result in a very thin layer being obtained without pin holes and other imperfections.

Once the copper circuit pattern layer has been electroplated, the remaining photoresist is removed, whereby the stainless steel plate will have a flash coating of copper of minimum thickness and a raised, accurately defined parallel wall circuit pattern of interconnected conductors as desired for the printed circuit board blank. Thereafter the surface having the flash layer and the conductor pattern thereon is covered with a uniform layer of printed circuit board laminate material such as an epoxy resin impregnated fiberglass mat. The epoxy is then cured in an appropriate fixture, applying pressure to the laminate material to be assured that the laminate and particularly the resin remains in intimate and continuous sheet contact with the flash layer and raised conductive layer. If desired, the assembly may be subjected to a vacuum prior to a curing of the resin to be sure of the removal of all of the air pockets and voids therein.

Since the copper flash layer will not adhere well to the stainless steel plate, particularly if the plate is polished, the now cured laminate with the desired circuit pattern effectively embedded therein may readily be separated from the stainless steel plate. Thereafter the flash layer of copper is etched away so that the conductive circuit pattern embedded in the insulative material is exposed as lying flush and coplanar with the surface of the insulative substrate. Obviously it may be seen that minimum etching will be required if the flash layer is kept as thin as reasonably possible under the circumstances.

At this stage the printed circuit board blank may be optically aligned in an appropriate drill fixture and the alignment holes 11 drilled therein, the alignment marks 17 typically being formed as part of the electrodeposited pattern and being accurately positioned by the photomask through which the initial photoresist was exposed. The now otherwise finished printed circuit board blank is coated with a suitable photoresist and packaged in an appropriate protective package for sale to the finished printed circuit board manufacturer.

To make a finished printed circuit board from the printed circuit board blank of FIG. 1, the photoresist on the printed circuit board is appropriately exposed and developed, and the printed circuit board etched to remove the undesired interconnects so as to leave those interconnects which will form the desired circuit pattern on the printed circuit board. After removal of the remaining photoresist the desired holes for component leads and socket terminals are drilled through the paths. Obviously provisions may be made for edge connectors and the like integrated with the pattern of conductors on the printed circuit board blank so that printed circuit boards having all of the mounting and connection techniques characteristic of prior art printed circuit boards may be readily fabricated.

Figure 2:
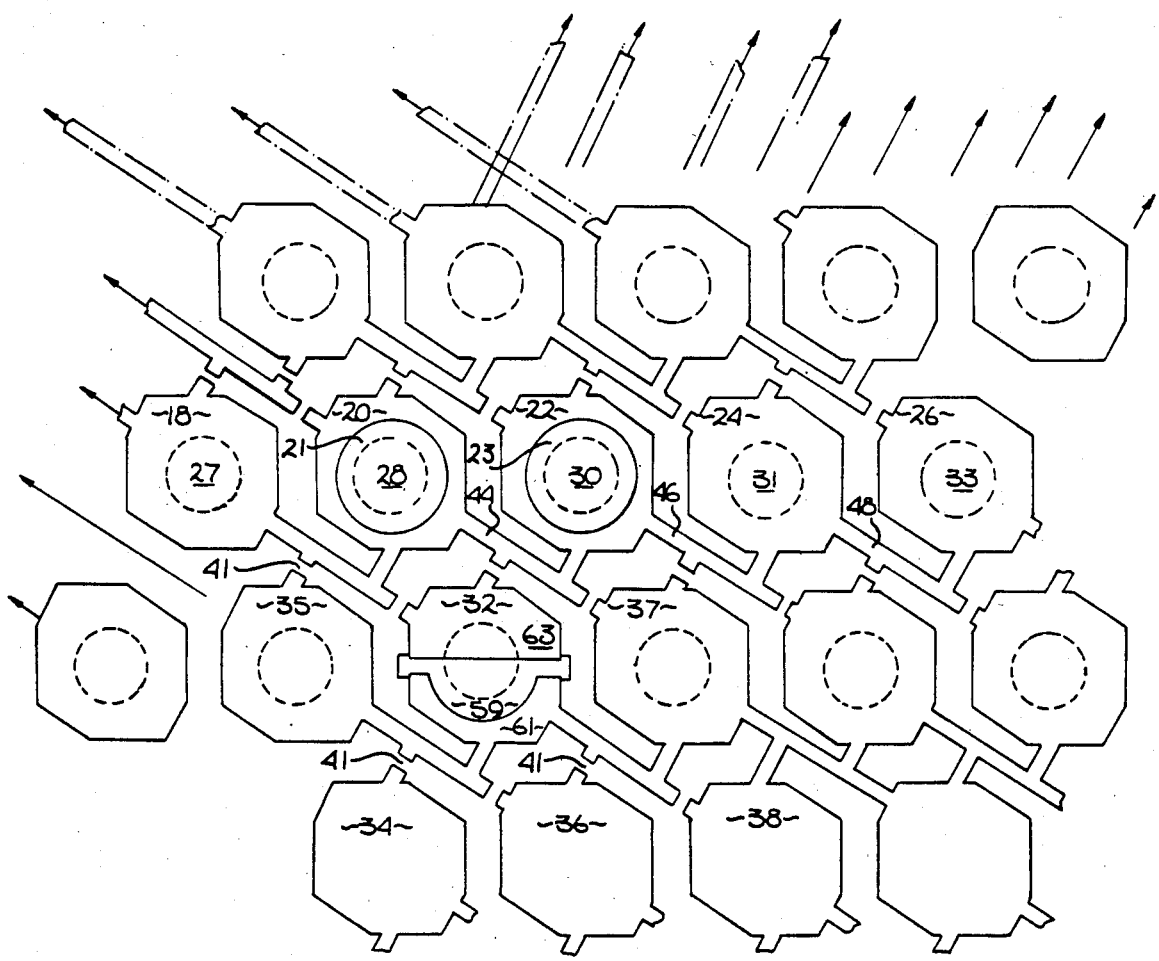
FIG. 2 is a plan view of a portion of the printed circuit board blank of FIG. 1, illustrating one embodiment form of pads and interconnects, processed to delete certain interconnects and open certain pads for selective through board connections for multilayer printed circuit boards.

FIG. 2 is a schematic representation of the circuit pattern of the printed circuit board blank of FIG. 1 illustrating the manner of opening various interconnects between pads (and various aspects particularly relevant to multilayer boards hereinafter described). It will be noted that the area of the interconnect lines which are open or removed represent only a very small fraction of the total circuit board area, and that the interconnect lines themselves fall in a predetermined matrix, so that the definition of the desired circuit pattern on the circuit board only depends upon the opening of a subset of interconnects selected for the particular circuit from the predetermined matrix of interconnects. This has a very definite and strong advantage over prior art printed circuit board fabrication techniques. In particular, in conventional copper clad printed circuit board fabrication, frequently a large percentage of the copper must be removed, as the final circuit covers only a relatively small fraction of the total area of the printed circuit board substrate. In the present invention however, the area of copper which must be removed to define the circuit is a very small fraction of the total circuit board area, saving on both power and etching materials. Further, the fundamental design rules for printed circuit boards regarding line spacing, edge definition, etc., become embodied in and inherent to the printed circuit board blank produced in very large quantities, as opposed to being defined by the printed circuit board manufacturer producing in lesser quantities. In that regard, because the pattern of conductors is a predetermined pattern in the printed circuit board blank, such pattern lends itself very well to automated inspection techniques such as optical image recognition techniques and reflected light sensing techniques, to name two examples. In that regard, the high volume production of the printed circuit board blank would readily justify automated inspection equipment, not readily justifiable for individual printed circuit boards and accordingly, the individual printed circuit board manufacturer could readily depend upon the quality of definition of the majority of the circuit characteristics as defined by the original pattern of conductors on the printed circuit board blank, thereby grossly reducing his own inspection requirements.

The exposure of the photoresist to define the pattern in which the interconnects are opened may of course be done by any of various techniques, such as contact printing processes or image projection processes. Of particular interest to the present invention however, are laser exposure devices such as EOCOM laser imaging systems, manufactured by EOCOM Electronics Systems of Tustin, Calif. These systems normally are computer controlled systems, operating from basic data stored on magnetic tape or disc. Systems like this are of particular interest to the present invention, as the relatively small total area of required exposure to define any circuit patten using a printed circuit blank in accordance with the present invention coupled with the predetermined matrix of regions, some of which will require exposing, allows increased scan rates between exposure areas, thereby grossly reducing the exposure time required over that which would be required in exposing a conventional full copper clad printed circuit board. Further, the fixed matrix, with all other edge definitions, line widths, etc., being determined by the printed circuit board blank, makes programming of the scan system particularly simple and particularly conducive to computer aided design and manufacturing techniques (commonly known as CAD/CAM).

The fixed matrix means that the only information required for any particular circuit realization is an identification of the points comprising a subset of the matrix points for that particular circuit, that matrix of points (interconnect opens required) as well as the number of circuit board layers required, may readily be determined by computer analysis, particularly by interactive printed circuit board layout graphics systems currently in use on at least a limited scale. In that regard, the fixed pattern of the printed circuit board blank actually simplifies the programming of the raster scan imaging system, as the number of fundamental image shapes which must be generated and positionally controlled by the imaging system as required by the present invention is far less than required by prior art printed circuit board technology, i.e., straight lines, various types of curves, lines at various angles, pads of various shapes, etc. Further, the use of the predetermined grid of the printed circuit board blank of FIG. 1 is not really restrictive, as current CAD/CAM equipment generally operate on a grid basis even though the printed circuit board blank will be a continuous copper clad board. Further, pin spacing on dual inline packages and other electronic devices have generally become standard, with components not having a predetermined lead spacing such as resistors normally being cut and bent to evenly fall within the standard hole spacing in prior art printed circuit boards. Likewise automatic board stuffing equipment will readily be operable on a predetermined matrix.

Referring again to FIG. 2, various aspects of the present invention as are particularly suited not only to single layer boards, but multilayer boards may be seen. In this figure, the upper row of pads remain connected horizontally to provide a horizontal conductive pad on that area of the printed circuit boards schematically represented therein, though have the interconnect to each pad in the next lower row etched away so as to be electrically independent of the second row of pads. The circular areas shown in phantom in the upper row of pads indicate the approximate diameter, in proportion to the pad size, which will be used for through holes if such a hole ultimately exists for the respective pad. The second row of pads, specifically pads 18, 20, 22, 24 and 26 are of course electrically isolated from the first row and, as illustrated, are electrically isolated from the third row in a similar manner. In addition however, part of pads 20 and 22 have been etched away to define central circular regions 21 and 23 which are larger in diameter than component mounting holes and/or board through holes 28 and 30 shown in phantom would be.

Figure 3:
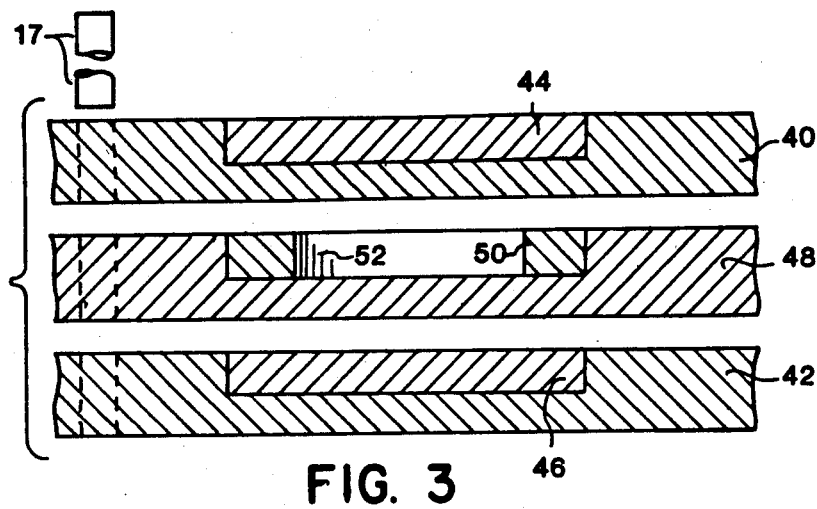
FIG. 3 is a cross section of three individual printed circuit boards for a three board multilayer stack illustrating the manner of making selective interlayer connections in a multilayer printed circuit board.
Figure 4:
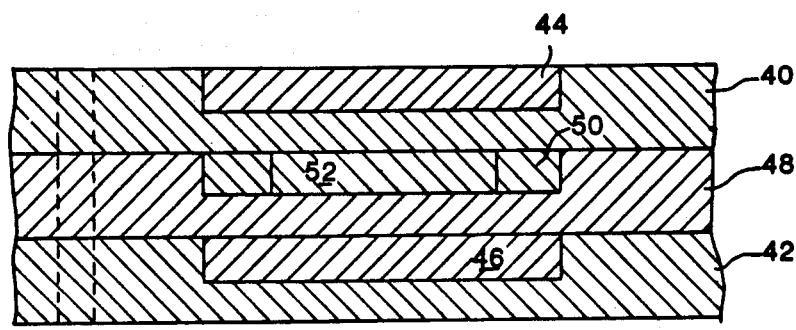
FIG. 4 is a cross sectional view of the boards of FIG. 3 after laminating.

Now referring to FIG. 3, cross sections of three printed circuit boards in accordance with the present invention immediately prior to lamination may be seen. for circuit boards 40 and 42, the conductive pads 44 and 46, respectively, may be seen. These conductive pads are shown limited in extent in the cross section of FIG. 3, as the cross section shown is not a cross section aligned with the interconnects on printed circuit board 48. As shown, pad 50 has had the center region etched away in much the same way as region 21 and 23 of pads 20 and 22 of FIG. 2, thereby defining a cavity-like region 52 at the center of the pad, which cavity is purposely made larger in diameter than the subsequently drilled through hole. When the boards are laminated as shown in FIG. 4, sufficient laminating adhesive will be used so that the region 52 in board 48 will be filled with the laminating adhesive, as will all regions of the interconnect network which have been etched away to define the desired circuit pattern on that particular circuit board. The lamination, of course, is done under pressure, with care being taken to accurately align the various printed circuit board layers with respect to each other, preferably through the use of index pins in the alignment holes in the various printed circuit board layers. If desired, the laminated stack may be placed in a vacuum temporarily to remove any air bubbles prior to curing of the laminating resin.

Figure 5:
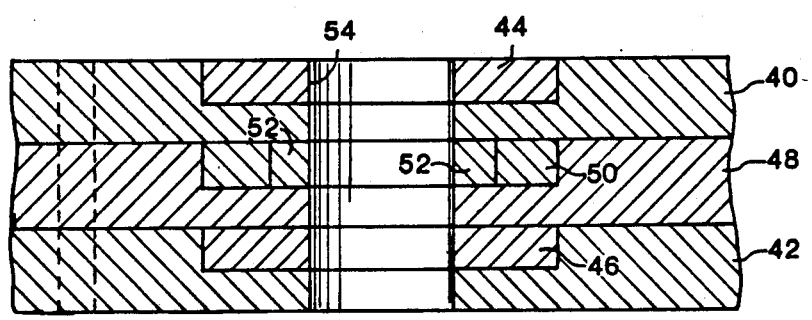
FIG. 5 is a cross section of the laminated boards of FIG. 4 after the through hole has been drilled.
Figure 6:
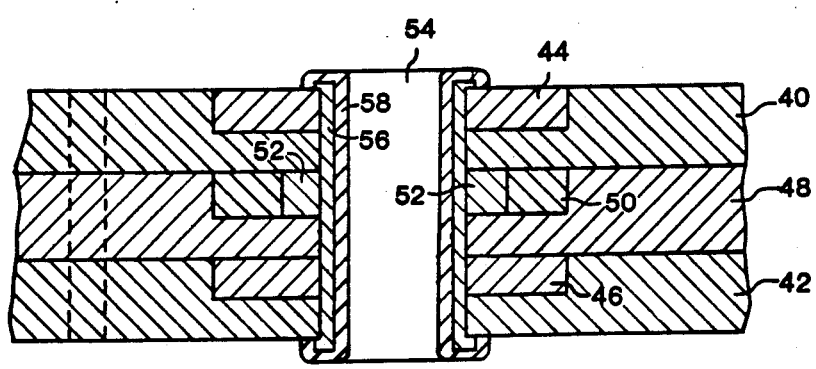
FIG. 6 is a cross section of the laminated boards of FIG. 4 after the through hole has been drilled and plated.

Following the laminating step of FIG. 4, the component mounting holes and additional holes for various board level interconnections are then accurately drilled, of course being accurately positioned with respect to the basic pattern of conductors of the printed circuit board blank of FIG. 1. This is illustrated in FIG. 5, where hole 54 through the stack of the three printed circuit boards 40, 42 and 48 is shown. As may be seen, the hole 54 passes through the copper pad 44 of printed circuit board 40 and pad 46 of printed circuit board 42, but is separated from the remaining portion 50 of the pad in printed circuit board 48 by the adhesive in region 52 of that circuit board. Thus when an electroless copper flash 56 is deposited in the hole 54 and a layer of electrodeposited copper 58 is plated thereover, a plated through hole making positive electrical contact between pad 44 and pad 46 is obtained, with pad 50 being electrically isolated therefrom. Thus it may be seen that the plated through holes which may also be used for component mounting holes may be used to make electrical contact between printed circuit board layers in any pattern desired, or for that matter to not make electrical contact between the various layers by having all layers except one which are aligned with any particular hole insulated from the plated through hole, as is layer 48 in the examples shown in FIGS. 3 through 6.

Through hole plating is of course known in the prior art. However, of particular aid to the practice of the present invention, and particularly the through hole plating, both for the electrolic copper flash and for the electroplating of the copper uniformly through the through hole, the apparatus and methods disclosed in U.S. Pat. No. 4,174,261 are especially helpful. That apparatus assures the supply of enriched plating solution throughout the entire depth of the through holes, so that a good and relatively uniform copper thickness is achieved throughout the depth of the hole, as opposed to a normal tendency to provide excessive copper build up at the mouth of the through holes and only a thin plate therebetween. Thus a very high quality through hole plating is achieved, improving the quality and the integrity of the ultimate flow soldering of the components (sockets, etc.) in place and at the same time achieving the interboard interconnects as desired.

Obviously, all solder connections will normally be made from one face of the multilayer printed circuit board, specifically the face having the exposed pattern of copper pads therein. Generally speaking, to insure good soldering of the components, all copper pads in that face not located at component mounting holes are preferably left in contact with the plated through hole, such as pad 44 shown in FIG. 6, though if that component lead is not intended for electrical connection to that facing board layer, the corresponding pad itself will be electrically isolated from the remainder of the circuit on that level by the etching away of the interconnects to that pad during the etching process illustrated with respect to FIG. 2 prior to the lamination of the printed circuit board stack.

Referring again to FIG. 2, another capability of the present invention is illustrated. In particular, assume by way of example that it is desired to have electrical connection between pad 35 and pad 37 in a horizontal direction without electrical connection to the pads thereabove or pads 34 and 36 therebelow, while at the same time using pad 32 for a through hole connection to other layers of the board. This may be readily achieved by exposing the printed circuit board blank in such a way that the portion 59 of pad 32 will be removed during the subsequent etching step, leaving the copper in region 63 and 61 of that pad. Accordingly, the void left in region 59 by the removal of the copper therefrom will be filled with laminating adhesive during the laminating process, whereby region 61 will be electrically insulated from the through hole while region 63 of course will be in direct electrical contact with the through hole plating. Accordingly, pads 35 and 37 are electrically connected through region 61 while at the same time interconnect line 44 will be coupled through region 63 of pad 32 to other printed circuit board layers.

There has been disclosed herein a new and unique printed circuit board blank and resulting printed circuit boards, particularly useful for the quick, low cost fabrication of printed circuit boards of any desired circuit. The printed circuit board blank and the methods of the present invention are also particularly useful in the fabrication of multilayer printed circuit boards to get a very high quality low cost multilayer circuit board with what can be provided as a standard off the shelf printed circuit board blank. The single etching step of the printed circuit board blank of the present invention may be accomplished using conventional contact or noncontact printing processes, and is particularly useful using laser exposure systems, as the matrix of areas which may need exposing prior to etching is predetermined and the percentage of the total area of the board which will need to be exposed to realize any circuit will be very small, so that the scan rate may be grossly increased over the relatively large areas never requiring exposure. Laser printers not already having this capability may be converted to have this capability for use with this invention thereby allowing a dramatic reduction of cost and time required to generate a board, all of course with the attendant energy saving associated with the much lower exposure time required. Further, the predetermined matrix characteristic of boards in accordance with use of computer aided design and computer aided manufacturing equipment (CAD/CAM), as the fundamental printed circuit board design rules become imbedded in the printed circuit board blank itself (i.e., line spacing, edge definition, line widths, etc.) whereby the only function required of the CAD/CAM equipment is the determination of the subset of the matrix interconnections selected from the totality of the matrix of interconnections which must be opened during the etching process, a much more simple computational task. Obviously, in comparison to conventional printed circuit board fabrication techniques using copper clad printed circuit boards, much less copper is required to prepare the initial printed circuit board blank, as only a percentage of the board rather than the entire board surface has copper thereon (or therein). Further, line widths may be smaller and edge definitions will be better with the present invention than was realizable in the prior art, as the preferred technique for fabricating the printed circuit board blanks of the present invention produces highly accurate square edge copper conductors and pads whereas prior art etching techniques typically result in substantial undercutting of the copper pattern throughout the finished printed circuit board. Similarly, far less copper will have to be removed from the printed circuit board blanks of the present invention to achieve any desired printed circuit board pattern, which removal may be done with a single exposure and etching process. This is to be compared with the prior art wherein raised patterns were used, allowing the mechanical opening of various interconnects to achieve the desired circuit pattern. Such a process was very time consuming and impractical for high production and/or high quality boards, as the breaking of the interconnects is a one at a time process not readily realizably accomplished without some degradation or other disturbance of the underlying board, or for that matter local loosening of the printed circuit board pattern.

The preferred embodiment of the invention has been described herewith with respect to a printed circuit board blank having a predetermined matrix or grid shape conductive pattern imbedded in the surface of a printed circuit board substrate so that the surface of the conductive layer is substantially flush with the surface of the substrate. Obviously, of course, one is not limited to any specific grid shape and accordingly, various grid shapes may be offered or custom shapes fabricated, using the flush grid or alternatively, by printing and etching commercial copper clad materials to provide a raised copper conductive grid using substantially the same processing as is used with conventional printed circuit board fabrication. By way of specific example one can use CAD/CAM plotting machines which are now commercially available, such as the commercially available Gerber plotting machines that convert schematic drawings to full blown printed circuit board designs, or various other forms of contact or noncontact printing may be used. Alternatively, one might use an electronic conversion system to take the plotting information in the form normally provided to a Gerber plotter and convert it to laser printing information if desired. In any event, regardless of the exposure technique utilized, the various cuts in the initial matrix or grid are normally formed by conventional etching processes. However, direct laser cutting may be used, if desired, to define the circuit directly by CAD/CAM equipment without putting down a photoresist or requiring the development and etching steps, as precise laser cutting location and control are readily achievable with present day equipment. Finally, it should be noted that while the present invention has been described with respect to printed circuit boards fabricated for use with lead mounted components and sockets, the invention is not to be so limited, as the predetermined matrix (or matrices) patterns inherent with the present invention, together with the ease of multilayer interconnect formation, makes the present invention also highly useful with leadless components, i.e., surface mount technology also. Obviously, of course, while the present invention has been disclosed and described with respect to certain preferred embodiments and methods, it will be understood to those skilled in the art that various changes in form and detail may be made therein without departing from the spirit and the scope thereof.

I claim:
1. A method of making printed circuit boards of any of a large number of circuit patterns comprising the steps of
  (a) proviiding a printed circuit board blank having an electrically insulative substrate with a predetermined two dimensionally repetitive pattern of conductive pads interconnected by a corresponding two dimensionally repetitive pattern of individual conductive pad interconnects electrically integral therewith on one surface thereof;
  (b) coating the conductive pattern with a photoresist;
  (c) exposing and developing the photoresist in a predetermined pattern to remove photoresist from those interconnects desired to be opened; and
  (d) removing the exposed interconnects whereby the conductive pads and the remaining interconnects provide the desired circuit pattern.
2. The method of claim 1 wherein step (c) comprises the step of exposing and developing the photoresist on selected interconnects of the conductive pattern.
3. The method of claim 1 wherein the exposing of step (c) is done on a raster scan exposure system.
4. The method of claim 1 wherein the exposing of step (c) is done on a raster scan laser exposure system.
5. The method of claim 1 wherein the conductive pattern is a copper pattern.

6. The method of claim 1 wherein step (a) comprises the step of providing a printed circuit board blank having the conductive pattern imbedded in one surface thereof so that the outer face of the conductive pattern is substantially coplanar with the respective surface of the substrate.

7. A method of making printed circuit boards of a desired circuit pattern comprising the steps of
 (a) coating a plate having a conductive surface with a photoresist;
 (b) exposing the photoresist and developing the photoresist to expose the conductive surface in a predetermined repetitive and interconnected pattern;
 (c) electroplating the exposed conductive surface so as to build up an electroplate in the predetermined repetitive and interconnected pattern;
 (d) transferring the electroplate from the plate to a nonconductive substrate to provide a printed circuit board blank having an electrically insulative substrate with a predetermined repetitive and interconnected conductive pattern on one surface thereof;
 (e) coating the conductive pattern with a photoresist;
 (f) exposing and developing the photoresist in a predetermined pattern to remove photoresist from those interconnects desired to be opened; and
 (g) removing the exposed interconnects whereby the remaining portions of said predetermined repetitive and interconnected conductive pattern provides the desired circuit pattern.

8. The method of claim 7 wherein step (d) comprises the steps of covering the electroplate on the plate with an uncured resin soaked carrier and curing the resin to bond the electroplate to the substrate formed by the resin impregnated carrier, and then separating the electroplate-substrate from the plate.

9. The method of claim 7 wherein step (f) comprises the step of exposing and developing the photoresist on selected interconnects of the conductive pattern.

10. The method of claim 7 wherein the exposing of step (f) is done on a raster scan exposure system.

11. The method of claim 7 wherein the exposing of step (f) is done on a raster scan laser exposure system.

12. The method of claim 9 wherein the conductive pattern is a copper pattern.

13. A printed circuit board blank comprising an electrically nonconductive substrate having a predetermined two dimensional repetitive pattern of conductive pads interconnected by a corresponding two dimensionally repetitive pattern of individual conductive pad interconnects electrically integral therewith, said pattern having an outer surface which is substantially coplanar with the respective surface of said substrate.

14. The printed circuit board blank of claim 13 wherein said conductive pattern is a copper pattern.

15. The printed circuit board blank of claim 14 wherein said copper is coated with a photoresist.

16. A method of making printed circuit boards of any of a large number of circuit patterns comprising the steps of
 (a) providing a printed circuit board blank having an electrically insulative substrate with a predetermined two dimensionally repetitive pattern of conductive pads interconnected by a corresponding two dimensionally repetitive pattern of conductive pad interconnects on one surface thereof; and
 (b) removing selected interconnects in the conductive pattern whereby the conductive pads and the remaining interconnects provide the desired circuit pattern.

17. The method of claim 16 wherein ste (b) comprises the step of removing the selected interconnects of the conductive pattern by a laser.

18. The method of claim 16 wherein the conductive pattern is a copper pattern.

19. The method of claim 16 wherein step (a) comprises the step of providing a printed circuit board blank having the conductive pattern imbedded in one surface thereof so that the outer face of the conductive pattern is substantially coplanar with the respective surface of the substrate.

20. A method of making printed circuit boards of a desired circuit pattern comprising the steps of
 (a) coating a plate having a conductive surface with a photoresist;
 (b) exposing the photoresist and developing the photoresist to expose the conductive surface in a predetermined repetitive and interconnected pattern;
 (c) electroplating the exposed conductive surface so as to build up an electroplate in the predetermined repetitive and interconnected pattern;
 (d) transferring the electroplate from the plate to a nonconductive substrate to provide a printed circuit board blank having an electrically insulative substrate with a predetermined repetitive and interconnected conductive pattern on one surface thereof;
 (e) removing selected interconnects in the conductive pattern whereby the remaining portions of said predetermined repetitive and interconnected conductive pattern provide the desired circuit pattern.

21. The method of claim 20 wherein step (d) comprises the steps of covering the electroplate on the plate with an uncured resin soaked carrier and curing the resin to bond the electroplate to the substrate formed by the resin impregnated carrier, and then separating the electroplate-substrate from the plate.

22. The method of claim 20 wherein step (e) comprises the step of removing the selected interconnects of the conductive pattern by a laser.

23. The method of claim 22 wherein the conductive pattern is a copper pattern.

24. A method of making multilayer printed circuit boards comprising
 (a) fabricating a plurality of thin printed circuit board layers for later laminating into a multilayer board, each printed circuit board layer being fabricated by the steps of
  (i) providing a printed circuit board blank having an electrically insulative substrate with a predetermined repetitive and interconnected conductive pattern on one surface thereof, and
  (ii) removing the conductive pattern at selected interconnects and isolation locations where board layer interconnection to that circuit is not desired, and in an amount to substantially exceed the through hole size to be later drilled, whereby the remaining portions of said predetermined repetitive and interconnected conductive pattern provides the desired circuit pattern;
 (b) aligning the plurality of printed circuit board layers with respect to each other and laminating the layers together using a laminating adhesive which will fill the isolation locations;
 (c) drilling the multilayer board to provide the predetermined through hole pattern; and (d) through plating the through holes with a conductive material, thereby for each hole, making electrical interconnection between all conductive patterns through which the respective through hole passes.

25. The method of claim 24 wherein the conductive pattern is a copper pattern.

26. The method of claim 25 wherein step (d) comprises the step of first electroless plating the through holes and then electroplating thereover.

27. The method of claim 26 wherein at least one of the electroless plating and electroplating steps is done using a forced delivery of plating solution through the through holes.

28. The method of claim 26 wherein both the electroless plating and the electroplating steps are done using a forced delivery of plating and the electroplating steps are done using a forced delivery of plating solution through the through holes.

29. The method of claim 24 wherein step (a) (ii) comprises the step of removing the conductive pattern at selected interconnects and isolation locations with a laser.

30. The method of claim 24 wherein the printed circuit board blank provided in step (a) (i) is a blank having a conductive pattern having an outer surface which is coplanar with the corresponding surface of the substrate.

31. A printed circuit board blank comprising an electrically nonconductive substrate having a predetermined two dimensional repetitive pattern of conductive pads interconnected by a corresponding two dimensionally repetitive pattern of individual conductive pad interconnects electrically integral therewith on one surface of said nonconductive substrate.

32. The printed circuit board blank of claim 31 wherein said conductive pattern is a copper pattern.

33. The printed circuit board blank of claim 32 wherein said copper is coated with a photoresist.

* * * * *